US011798725B2

(12) United States Patent
Komagaki et al.

(10) Patent No.: US 11,798,725 B2
(45) Date of Patent: Oct. 24, 2023

(54) MAGNETIC LAMINATE, MAGNETIC STRUCTURE INCLUDING SAME, ELECTRONIC COMPONENT INCLUDING MAGNETIC LAMINATE OR MAGNETIC STRUCTURE, AND METHOD FOR PRODUCING MAGNETIC LAMINATE

(71) Applicant: Murata Manufacturing Co., Ltd., Kyoto-fu (JP)

(72) Inventors: Kojiro Komagaki, Nagaokakyo (JP); Kenji Sakaguchi, Nagaokakyo (JP)

(73) Assignee: Murata Manufacturing Co., Ltd., Kyoto-fu (JP)

(*) Notice: Subject to any disclaimer, the term of this patent is extended or adjusted under 35 U.S.C. 154(b) by 533 days.

(21) Appl. No.: 16/925,208

(22) Filed: Jul. 9, 2020

(65) Prior Publication Data

US 2021/0012942 A1 Jan. 14, 2021

(30) Foreign Application Priority Data

Jul. 12, 2019 (JP) ................................ 2019-130327

(51) Int. Cl.
*H01F 27/28* (2006.01)
*H01F 27/245* (2006.01)
(Continued)

(52) U.S. Cl.
CPC ........... *H01F 27/245* (2013.01); *H01F 1/153* (2013.01); *H01F 27/28* (2013.01); *H01F 41/0233* (2013.01)

(58) Field of Classification Search
CPC ........ H01F 27/245; H01F 1/153; H01F 27/28; H01F 41/0233; H01F 10/3204;
(Continued)

(56) References Cited

U.S. PATENT DOCUMENTS 4,520,556 A * 6/1985 Pasko, Jr. ............ H01F 27/245 336/212
5,534,355 A 7/1996 Okuno et al.
(Continued)

FOREIGN PATENT DOCUMENTS

CN 101154392 A * 4/2008 ............ B82Y 10/00
CN 101154392 A 4/2008
(Continued)

OTHER PUBLICATIONS

An Office Action mailed by China National Intellectual Property Administration dated Jan. 13, 2022, which corresponds to Chinese Patent Application No. 202010656393.7 and is related to U.S. Appl. No. 16/925,208 with English language translation.
(Continued)

*Primary Examiner* — Shawki S Ismail
*Assistant Examiner* — Kazi S Hossain
(74) *Attorney, Agent, or Firm* — Studebaker & Brackett PC

(57) ABSTRACT

A magnetic laminate having further suppressed magnetic saturation and higher DC superposition characteristics, a magnetic structure including the same, and an electronic component including the magnetic laminate or the magnetic structure. A magnetic laminate in which magnetic metal layers and non-magnetic metal layers are alternately laminated, wherein the non-magnetic metal layer is disposed between the magnetic metal layers; the magnetic metal layer contains an amorphous material; and the non-magnetic metal layer contains at least one element selected from the group consisting of Cr, Ru, Rh, Ir, Re, and Cu, and has an average thickness of 0.4 nm or more and 1.5 nm or less (i.e., from 0.4 nm to 1.5 nm).

18 Claims, 8 Drawing Sheets

(51) Int. Cl.
*H01F 1/153* (2006.01)
*H01F 41/02* (2006.01)

(58) Field of Classification Search
CPC ...... H01F 10/138; H01F 17/003; H01F 17/06; H01F 17/04; H01F 27/24; H01F 27/34; H01F 41/02; H01F 41/30; H01F 41/32
USPC .......................................... 336/221, 200, 232
See application file for complete search history.

(56) References Cited

U.S. PATENT DOCUMENTS

| | | | | |
|---|---|---|---|---|
| 6,114,850 | A * | 9/2000 | Hayashi | B82Y 25/00 324/252 |
| 9,564,165 | B2 | 2/2017 | Fontana, Jr. et al. | |
| 2008/0070063 | A1 | 3/2008 | Ibusuki et al. | |
| 2014/0191838 | A1* | 7/2014 | Yoshida | H01F 27/2804 336/200 |
| 2014/0218821 | A1* | 8/2014 | Lu | H01F 10/3204 360/110 |
| 2018/0301270 | A1 | 10/2018 | Yang et al. | |
| 2019/0051822 | A1* | 2/2019 | Chatterjee | G11C 11/161 |
| 2020/0395167 | A1* | 12/2020 | Haseyama | H01F 41/046 |

FOREIGN PATENT DOCUMENTS

| | | | |
|---|---|---|---|
| CN | 105761880 | A | 7/2016 |
| JP | H04-212402 | A | 8/1992 |
| JP | 2008-072014 | A | 3/2008 |
| JP | 2012-174824 | A | 9/2012 |
| JP | 2013-046032 | A | 3/2013 |
| JP | 2018164041 | A * | 10/2018 |
| JP | 2018164041 | A | 10/2018 |

OTHER PUBLICATIONS

An Office Action; "Notice of Reasons for Refusal," mailed by the Japanese Patent Office dated Mar. 15, 2022, which corresponds to Japanese Patent Application No. 2019-130327 and is related to U.S. Appl. No. 16/925,208 with English language translation.

* cited by examiner

MAGNETIC LAMINATE, MAGNETIC STRUCTURE INCLUDING SAME, ELECTRONIC COMPONENT INCLUDING MAGNETIC LAMINATE OR MAGNETIC STRUCTURE, AND METHOD FOR PRODUCING MAGNETIC LAMINATE

CROSS-REFERENCE TO RELATED APPLICATION

This application claims benefit of priority to Japanese Patent Application No. 2019-130327, filed Jul. 12, 2019, the entire content of which is incorporated herein by reference.

BACKGROUND

Technical Field

The present disclosure relates to a magnetic laminate, a magnetic structure including the same, an electronic component including the magnetic laminate or the magnetic structure, and a method for producing the magnetic laminate.

Background Art

As a magnetic material used for a core (magnetic core) of an electronic component such as a coil component, a material having a high magnetic permeability and a high saturation magnetic flux density is required.

U.S. Pat. No. 9,564,165 discloses an on-chip magnetic device which includes a first magnetic unit including first and second magnetic layers and a non-magnetic spacer layer, at least one additional magnetic unit including first and second magnetic layers and a non-magnetic spacer layer, and a resistive spacer disposed between the first magnetic unit and the at least one additional magnetic unit.

Japanese Patent Application Laid-Open No. 2018-164041 discloses a ferromagnetic multilayer thin film including a base layer and a ferromagnetic layer. The ferromagnetic layer includes a nanocrystalline layer and an amorphous layer. The nanocrystalline layer contains nano-sized microcrystals. The amorphous layer does not contain nano-sized microcrystals. The nanocrystalline layer and the amorphous layer are separated in a thickness direction in the ferromagnetic layer.

SUMMARY

Electronic components produced by a thin film process have been used for the purpose of reducing the size and height and the like of the electronic components. Such thin-film electronic components (such as thin film inductors) are required to have further improved DC superposition characteristics.

The present disclosure provides a magnetic laminate having further suppressed magnetic saturation and higher DC superposition characteristics, a magnetic structure including the same, and an electronic component including the magnetic laminate or the magnetic structure.

In a magnetic laminate in which magnetic metal layers and non-magnetic metal layers are alternately laminated, the present inventors have found that the magnetic laminate having higher DC superposition characteristics can be obtained by employing a structure in which the magnetic metal layers are coupled in an antiparallel manner with the non-magnetic metal layer interposed therebetween, and have completed the present disclosure.

According to a first summary of the present disclosure, there is provided a magnetic laminate in which magnetic metal layers and non-magnetic metal layers are alternately laminated, the non-magnetic metal layer being disposed between the magnetic metal layers, the magnetic metal layer containing an amorphous material, and the non-magnetic metal layer containing at least one element selected from the group consisting of Cr, Ru, Rh, Ir, Re, and Cu, and having an average thickness of 0.4 nm or more and 1.5 nm or less (i.e., from 0.4 nm to 1.5 nm).

According to a second summary of the present disclosure, there is provided a magnetic laminate in which magnetic metal layers and non-magnetic metal layers are alternately laminated, the non-magnetic metal layer being disposed between the magnetic metal layers, the magnetic metal layer containing an amorphous material, and the magnetic metal layers being coupled in an antiparallel manner with the non-magnetic metal layer interposed therebetween.

According to a third summary of the present disclosure, there is provided a magnetic structure in which magnetic layers and insulating layers are alternately laminated, wherein the insulating layer is disposed between the magnetic layers; and the magnetic layer is any one of the above-described magnetic laminates.

According to a fourth summary of the present disclosure, there is provided an electronic component including any one of the above-described magnetic laminates or the above-described magnetic structures.

According to a fifth summary of the present disclosure, there is provided a method for producing any one of the above-described magnetic laminates, the method including the step of alternately forming amorphous magnetic metal materials and non-magnetic metal materials according to a thin film forming method, to form a magnetic laminate in which magnetic metal layers and non-magnetic metal layers are alternately laminated, and the non-magnetic metal layer is disposed between the magnetic metal layers.

According to a magnetic laminate according to the present disclosure, magnetic saturation can be further suppressed, and higher DC superposition characteristics can be obtained. According to a magnetic structure of the present disclosure, magnetic saturation can be further suppressed, and higher DC superposition characteristics can be obtained. According to an electronic component of the present disclosure, magnetic saturation can be further suppressed, and higher DC superposition characteristics can be obtained. According to a method for producing a magnetic laminate according to the present disclosure, it is possible to produce a magnetic laminate having further suppressed magnetic saturation and higher DC superposition characteristics.

DETAILED DESCRIPTION

Hereinafter, embodiments of the present disclosure will be described in detail with reference to the drawings. However, the embodiments to be described below are for the illustrative purposes, and the present disclosure is not limited to the following embodiments.

[Magnetic Laminate]

Figure 1:
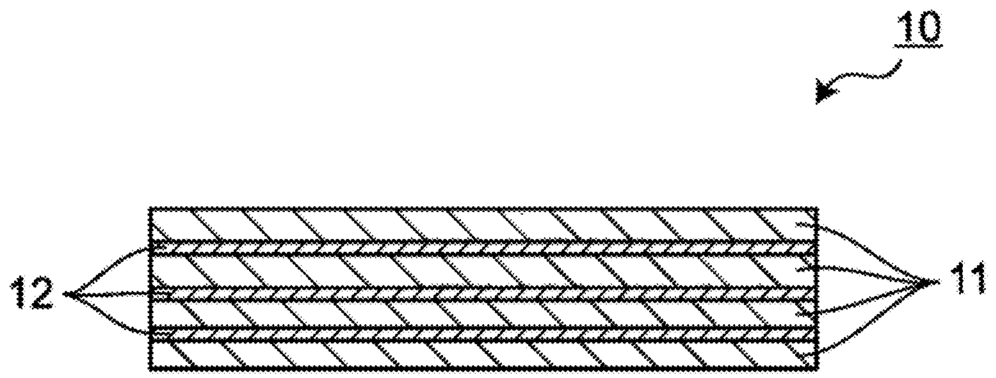
FIG. 1 is a schematic cross-sectional view of a magnetic laminate according to one embodiment of the present disclosure.

FIG. 1 shows a schematic cross-sectional view of a magnetic laminate according to one embodiment of the present disclosure. As shown in FIG. 1, in a magnetic laminate 10, magnetic metal layers 11 and non-magnetic metal layers 12 are alternately laminated. A non-magnetic metal layer 12 is disposed between the magnetic metal layers 11. In the configuration shown in FIG. 1, a total of four magnetic metal layers 11 and a total of three non-magnetic metal layers 12 are laminated, but the present disclosure is not limited to this configuration, and the number of the layers to be laminated can be optionally selected depending on desired characteristics and the like. For example, the magnetic laminate 10 may have a three-layer structure in which a first magnetic metal layer 11, a non-magnetic metal layer 12, and a second magnetic metal layer 11 are laminated in this order (a structure including a total of two magnetic metal layers 11 and one non-magnetic metal layer 12). The magnetic laminate 10 more preferably has a structure in which five or more magnetic metal layers 11 and non-magnetic metal layers 12 are alternately laminated, and still more preferably has a structure in which seven or more magnetic metal layers 11 and non-magnetic metal layers 12 are alternately laminated.

The magnetic metal layer 11 contains an amorphous material. When the magnetic metal layer 11 contains the amorphous material, the coercive force of the magnetic metal layer 11 can be reduced.

The non-magnetic metal layer 12 contains at least one element selected from the group consisting of Cr, Ru, Rh, Ir, Re, and Cu, and the non-magnetic metal layer 12 has an average thickness of 0.4 nm or more and 1.5 nm or more. The non-magnetic metal layer 12 has such a composition and an average thickness, whereby magnetization directions between the magnetic metal layers 11 can be arranged in an antiparallel manner, which allows the magnetic metal layers 11 to be coupled to each other in an antiparallel manner with the non-magnetic metal layer 12 interposed therebetween. The magnetic metal layers 11 are coupled to each other in an antiparallel manner, whereby the anisotropic magnetic field of the magnetic laminate 10 increases, which makes it possible to further suppress magnetic saturation. As a result, higher DC superposition characteristics can be achieved.

The anisotropic magnetic field of the magnetic laminate 10 increases, so that the magnetic resonant frequency of the magnetic laminate 10 shifts to a higher frequency side. Therefore, when the magnetic laminate 10 is used as a magnetic core of an electronic component such as a thin film inductor, the frequency characteristics of the electronic component can be improved.

The average thickness of the non-magnetic metal layer 12 can be measured by a method to be described below. First, a sample including the magnetic laminate 10 is sliced by FIB (focused ion beam) processing to obtain a cross section parallel to the lamination direction of the magnetic laminate 10. This cross section is shot with a TEM (transmission electron microscope), and the thickness of the non-magnetic metal layer 12 is measured in the obtained TEM image. Thicknesses are measured at any ten locations, and the average value of the measured thicknesses is calculated. This average value is taken as the average thickness of the non-magnetic metal layer 12.

(Magnetic Metal Layer)

The magnetic metal layer 11 is a layer containing an amorphous magnetic metal material. Preferably, the magnetic metal layer 11 further contains nanocrystalline grains dispersed in the amorphous material. The term "nanocrystalline grains" means grains made of metal magnetic crystals and having a nano-sized grain diameter. When the magnetic metal layer 11 contains the nanocrystalline grains, the saturation magnetization of the magnetic metal layer 11 can be further increased, which can accordingly achieve a higher magnetic permeability. Therefore, when the magnetic laminate composed of the magnetic metal layer 11 containing the nanocrystalline grains dispersed in the amorphous material is used as the magnetic core of the electronic component such as a thin film inductor, the inductance of the electronic component can be further increased. Furthermore, when the magnetic metal layer 11 contains the nanocrystalline grains, the antiparallel coupling between the magnetic metal layers 11 can further increase the anisotropic magnetic field, which makes it possible to further suppress magnetic saturation due to a current magnetic field. As a result, higher DC superposition characteristics can be achieved.

The average crystal grain diameter of the nanocrystalline grains is preferably 5 nm or more and 30 nm or less (i.e., from 5 nm to 30 nm). When the average crystal grain diameter of the nanocrystalline grains is within the above range, both a smaller coercive force and a higher saturation magnetization can be achieved. The average crystal grain diameter of the nanocrystalline grains can be calculated using the Scherrer formula (average crystal grain diameter$=0.892\lambda/(\beta \cos \theta)$, $\lambda$: X-ray wavelength, $\theta$: Bragg diffraction angle) from the half width ($\beta$) of a diffraction peak obtained by the X-ray diffraction method.

The magnetic metal layer 11 may be made of only an amorphous material. When the magnetic metal layer 11 is made of only an amorphous material, a layer having high flatness is relatively easily formed. Therefore, when the magnetic metal layer 11 made of only an amorphous material is used, the magnetic laminate 10 can be more easily produced. When the magnetic metal layer 11 contains the nanocrystalline grains, and the average thickness of the magnetic metal layer 11 is relatively small, crystal grain boundaries may cause irregularities of 2 nm or more to occur in the surface of the magnetic metal layer 11. This may make it difficult to uniformly prepare the non-magnetic metal layer 12 having a thickness of about 1 nm on the surface of the magnetic metal layer 11. Meanwhile, when the magnetic metal layer 11 is made of only an amorphous material, no crystal grain boundaries are present in the magnetic metal layer 11, whereby the irregularities of the surface of the magnetic metal layer 11 can be reduced. For example, the irregularities can be suppressed to 0.4 nm or less. The magnetic metal layer 11 made of only an amorphous material can have a smaller coercive force.

The composition of the magnetic metal layer 11 is not particularly limited, and for example, the magnetic metal layer 11 may have a composition (molar parts) represented by the general formula $Fe_{100-a-b-c-d-e-f}M_aP_bCu_cCo_dNi_eM'_f$ (molar parts) (wherein: M is at least one element selected from the group consisting of Si, B, and C; M' is at least one element selected from the group consisting of V, Zr, Nb, Mo, Hf, Ta, W, Sn, Bi, and In; and a, b, c, d, e, and f are such that molar parts of the elements: $0.5 \le a \le 20$, $1 \le b \le 10$, $0.1 \le c \le 1.5$, $0 \le d \le 5$, $0 \le e \le 5$, and $0 \le f \le 3$ are set when the entire composition represented by the general formula is 100 molar parts). In the general formula $Fe_{100-a-b-c-d-e-f}M_aP_bCu_cCo_dNi_eM'_f$, $3 \le a \le 20$ is more preferably set. The magnetic metal layer 11 preferably has a composition (molar parts) represented by the general formula $Fe_{100-a-b-c}M_aP_bCu_c$ (wherein M is at least one element selected from the group consisting of Si, B, and C, and a, b, and c are such that molar parts of the elements: $0.5 \le a \le 20$, $1 \le b \le 10$, and $0.1 \le c \le 1.5$ are set when the entire composition represented by the general formula is 100 molar parts. In the general formula $Fe_{100-a-b-c}M_aP_bCu_c$, $3 \le a \le 20$ is more preferably set. The magnetic metal layer 11 may further contain a small amount of unavoidable impurities. When the magnetic laminate 10 includes a plurality of magnetic metal layers 11, the magnetic metal layers 11 may have the same composition or different compositions.

The average thickness of the magnetic metal layer 11 is preferably 100 nm or less. When the average thickness is 100 nm or less, the occurrence of eddy currents in the magnetic laminate 10 can be suppressed, which makes it possible to reduce deteriorated characteristics due to the occurrence of the eddy currents. The average thickness of the magnetic metal layer 11 is preferably 20 nm or more. When the average thickness is 20 nm or more, the number of nanocrystalline grains contained in the magnetic metal layer 11 is ensured, which provides better magnetic properties. When the magnetic laminate 10 includes a plurality of magnetic metal layers 11, the average thicknesses of the magnetic metal layers 11 may be the same or different from each other. The average thickness of the magnetic metal layer 11 can be measured in the same manner as in the average thickness of the non-magnetic metal layer 12.

(Non-Magnetic Metal Layer)

The non-magnetic metal layer 12 contains at least one element selected from the group consisting of Cr (chromium), Ru (ruthenium), Rh (rhodium), Ir (iridium), Re (rhenium), and Cu (copper). Among them, Cr and Ru can further enhance the antiparallel coupling between the magnetic metal layers 11, which is preferable. Preferably, the non-magnetic metal layer 12 is made of only at least one element selected from the group consisting of Cr, Ru, Rh, Ir, Re, and Cu. In this case, the non-magnetic metal layer 12 may contain a small amount of unavoidable impurities.

The non-magnetic metal layer 12 is preferably provided so that the magnetic metal layers 11 brought into contact with the upper and lower surfaces of the non-magnetic metal layer 12 are not brought into contact with each other. However, the non-magnetic metal layer 12 may be provided so that the magnetic metal layers 11 brought into contact with the upper and lower surfaces of the non-magnetic metal layer 12 are partially brought into contact with each other. In other words, the non-magnetic metal layer 12 is preferably formed on the entire surface of the magnetic metal layer 11, but the non-magnetic metal layer 12 may be intermittently formed on a part of the surface of the magnetic metal layer 11. When the magnetic laminate 10 includes a plurality of non-magnetic metal layers 12, the non-magnetic metal layers 12 may have the same composition or different compositions. When the magnetic laminate 10 includes a plurality of non-magnetic metal layers 12, the average thicknesses of the non-magnetic metal layers 12 may be the same or different from each other.

[Method for Producing Magnetic Laminate]

Next, a method for producing the magnetic laminate 10 will be described below. The method for producing the magnetic laminate 10 includes the step of alternately forming amorphous magnetic metal materials and non-magnetic metal materials according to a thin film forming method, to alternately laminate magnetic metal layers 11 and non-magnetic metal layers 12, and forming a magnetic laminate 10 in which the non-magnetic metal layer 12 is disposed between the magnetic metal layers 11. The amorphous magnetic metal material relatively easily forms a layer having high flatness. Therefore, the magnetic laminate 10 can be easily produced by using the amorphous magnetic metal material. The magnetic metal layer 11 is preferably formed so that the thickness thereof is 20 nm or more and 100 nm or less (i.e., from 20 nm to 100 nm).

The magnetic metal layer 11 and the non-magnetic metal layer 12 are preferably formed by thin film forming methods such as sputtering, plating, photolithography, and/or reactive ion etching (RIE). By using these thin film forming methods, a thin (height reduction) product can be produced.

Each of the magnetic metal layer 11 and the non-magnetic metal layer 12 may be formed by continuously laminating a plurality of layers, but it is preferably formed of a single layer.

Preferably, the method for producing the magnetic laminate 10 further includes the step of subjecting the magnetic laminate 10 to a heat treatment. By the heat treatment, at least a part of the amorphous magnetic metal material configuring the magnetic metal layer 11 can be nanocrystallized, which allows nanocrystalline grains to be precipitated in the magnetic metal layer 11. The heat treatment can be performed by increasing the temperature to 350° C. or higher and 500° C. or lower (i.e., from 350° C. to 500° C.) at a temperature increase rate of 400° C./min or more and 600° C./min or less (i.e., from 400° C./min to 600° C./min) under a vacuum of $10^{-2}$ Pa or less or an atmosphere in which oxygen in the air is replaced with an inert gas, followed by natural cooling.

The magnetic laminate 10 produced by such a method has further suppressed magnetic saturation and higher DC superposition characteristics.

[Magnetic Structure]

Figure 2:
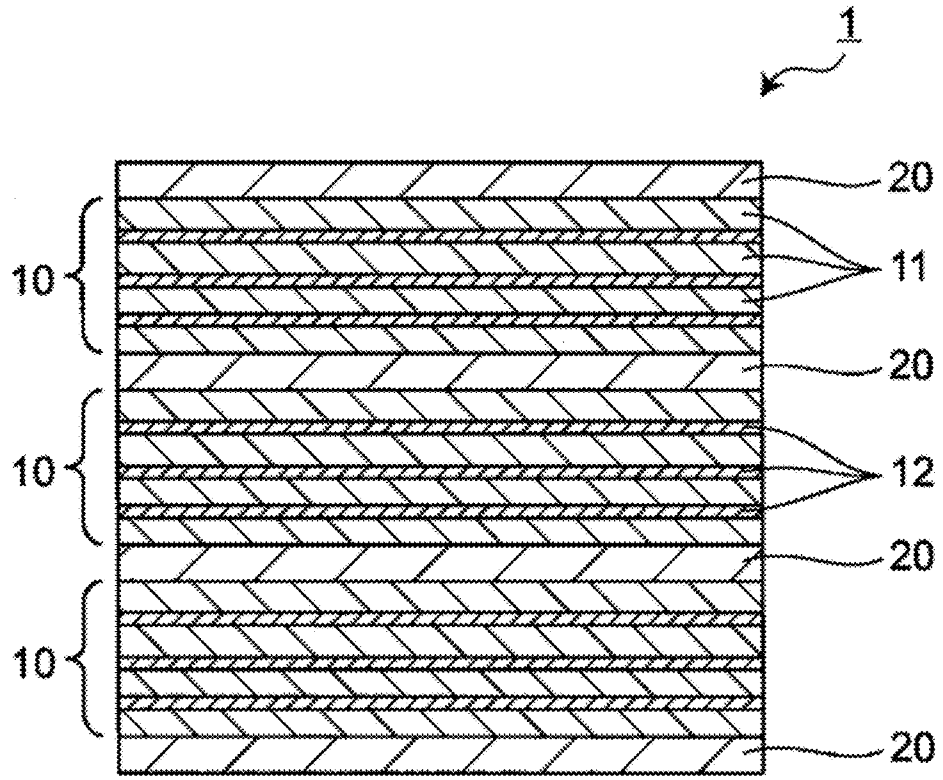
FIG. 2 is a schematic cross-sectional view of a magnetic structure according to one embodiment of the present disclosure.

FIG. 2 shows a schematic cross-sectional view of a magnetic structure 1 according to one embodiment of the present disclosure. As shown in FIG. 2, in the magnetic structure 1, magnetic layers 10 and insulating layers 20 are alternately laminated. The insulating layer 20 is disposed between the magnetic layers 10. In the configuration shown in FIG. 2, a total of three magnetic layers 10 and a total of four insulating layers 20 are laminated, but the present disclosure is not limited to this configuration, and the number of the layers to be laminated can be optionally selected depending on desired characteristics and the like. For example, the magnetic structure 1 may have a three-layer structure in which a first insulating layer 20, a magnetic layer 10, and a second insulating layer 20 are laminated in this order (a structure including one magnetic layer 10 and total of two insulating layers 20).

(Magnetic Layer)

The magnetic layer 10 is the magnetic laminate 10 according to the embodiment of the present disclosure. By using the magnetic laminate 10 according to the embodiment of the present disclosure as the magnetic layer 10, magnetic saturation can be further suppressed, and higher DC superposition characteristics can be obtained. The occurrence of eddy currents in the magnetic structure 1 can be suppressed, which makes it possible to improve frequency characteristics. That is, deterioration in magnetic characteristics can be suppressed even in a high frequency region. The specific configuration of the magnetic layer 10 is as described above in relation to the magnetic laminate. When the magnetic structure 1 includes a plurality of magnetic layers 10, the magnetic layers 10 may have the same configuration (the numbers, average thicknesses, and compositions and the like of the magnetic metal layers 11 and non-magnetic metal layers 12) or different configurations.

(Insulating Layer)

The insulating layer 20 is a layer made of an insulating material. The insulating layer 20 preferably contains at least one selected from the group consisting of aluminum oxide, silicon oxide, aluminum nitride, silicon nitride, magnesium oxide, and zirconium oxide. The insulating layer 20 is preferably made of a material having a low relative permittivity. Specifically, the insulating layer 20 is made of a material having a relative permittivity of preferably 10 or less, more preferably 8 or less, and still more preferably 4 or less. Therefore, the insulating layer 20 preferably contains silicon oxide, and more preferably contains only of silicon oxide. The insulating layer 20 may contain a small amount of unavoidable impurities in addition to the above-described insulating material. When the magnetic structure 1 includes a plurality of insulating layers 20, the insulating layers 20 may have the same composition or different compositions.

The average thickness of the insulating layer 20 is preferably 5 nm or more and 100 nm or less (i.e., from 5 nm to 100 nm), more preferably 7 nm or more and 50 nm or less (i.e., from 7 nm to 50 nm), still more preferably 8 nm or more and 30 nm or less (i.e., from 8 nm to 30 nm), and particularly preferably 10 nm or more and 20 nm or less (i.e., from 10 nm to 20 nm). When the average thickness is 5 nm or more, sufficient electrical insulation between the magnetic layers 10 can be ensured. When the magnetic structure 1 includes a plurality of insulating layers 20, the average thicknesses of the insulating layers 20 may be the same or different from each other. The average thickness of the insulating layer 20 can be measured in the same manner as in the average thickness of the non-magnetic metal layer 12.

[Method for Producing Magnetic Structure]

Next, an example of a method for producing the magnetic structure 1 will be described below. First, an insulating layer 20 having a predetermined thickness is formed on a substrate such as a silicon substrate. Next, a magnetic metal layer 11 having a predetermined thickness is formed on the insulating layer 20, and a non-magnetic metal layer 12 having a predetermined thickness is formed thereon. A magnetic layer 10 is obtained by alternately laminating the magnetic metal layers 11 and the non-magnetic metal layers 12 a predetermined number of times. The insulating layers 20 and the magnetic layers 10 are alternately laminated a predetermined number of times to obtain the magnetic structure 1 having a predetermined thickness.

The magnetic metal layer 11, the non-magnetic metal layer 12, and the insulating layer 20 are preferably formed by thin film processes such as sputtering, plating, photolithography, and/or reactive ion etching (RIE). By using these thin film processes, thin (height reduction) products can be produced.

Each of the magnetic metal layer 11, the non-magnetic metal layer 12, and the insulating layer 20 may be formed by continuously laminating a plurality of layers, but it is preferably formed of a single layer.

The magnetic structure 1 thus obtained may be subjected to a heat treatment. The conditions for the heat treatment are the same as the above-described conditions for the heat treatment for the magnetic laminate 10. By the heat treatment, at least a part of the amorphous magnetic metal material configuring the magnetic metal layer 11 can be nanocrystallized, which allows nanocrystalline grains to be precipitated in the magnetic metal layer 11.

The magnetic structure 1 produced by such a method has further suppressed magnetic saturation and higher DC superposition characteristics.

[Electronic Component]

Figure 3:
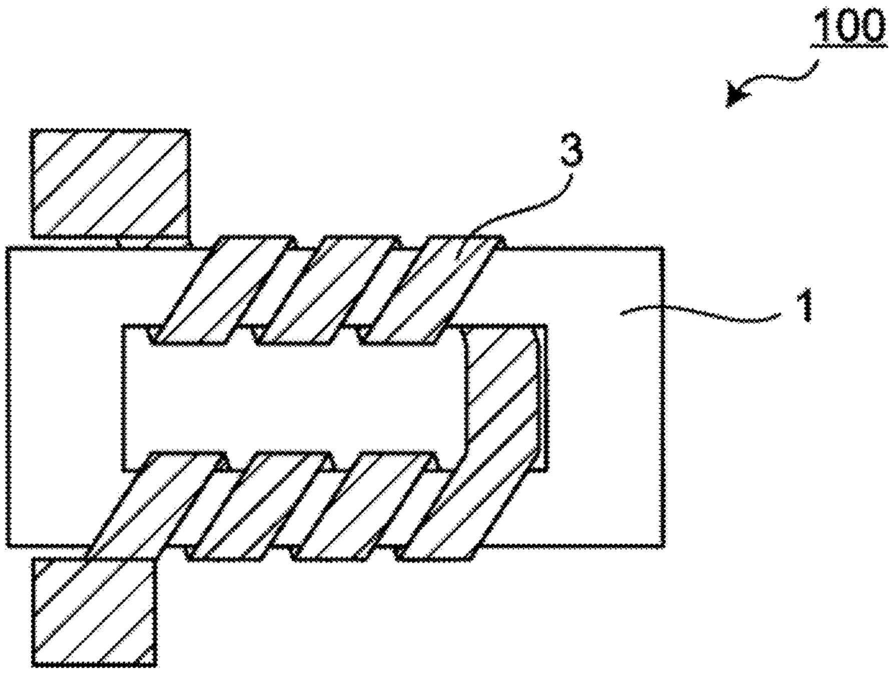
FIG. 3 is a schematic view showing the structure of an electronic component according to one embodiment of the present disclosure.

FIG. 3 shows a schematic cross-sectional view of an electronic component 100 according to one embodiment of the present disclosure. The electronic component 100 includes the magnetic laminate 10 or the magnetic structure 1 according to the embodiment of the present disclosure. In the configuration example shown in FIG. 3, the electronic component 100 includes the magnetic structure 1, but the electronic component 100 may include the magnetic laminate 10 instead of the magnetic structure 1. The electronic component 100 includes the magnetic laminate 10 or the magnetic structure 1 according to the embodiment of the present disclosure, whereby the electronic component 100 has further suppressed magnetic saturation and higher DC superposition characteristics. The electronic component 100 shown in FIG. 3 further includes a coil conductor 3, but the coil conductor 3 is not an essential component.

(Magnetic Core)

The electronic component 100 includes the magnetic laminate 10 or the magnetic structure 1 as the magnetic core (core). The magnetic laminate 10 or the magnetic structure 1 is preferably annular. In the present specification, the term "annular" means a shape which forms a closed space in plan view. The term "annular" includes various shapes such as polygons (such as a triangle and a rectangle) (including a square and an oblong figure), a circle, and an ellipse in plan view. When the magnetic core (the magnetic laminate 10 or the magnetic structure 1) is annular, the leakage of a magnetic flux to the outside can be suppressed, whereby the loss of inductance can be suppressed.

(Coil Conductor)

As shown in FIG. 3, the electronic component 100 may further include the coil conductor 3. The coil conductor 3 is made of a conductor such as Cu. Preferably, the entire surface of the coil conductor 3 is covered with an insulating film (not shown). It is preferable that, when the electronic component 100 includes the coil conductor 3, the magnetic laminate 10 or the magnetic structure 1 is located inside the winding part of the coil conductor 3, and the winding axis direction of the coil conductor 3 is substantially perpendicular to the lamination direction of the magnetic laminate 10 or the magnetic structure 1. By employing such a configuration, the electronic component 100 such as a thin film inductor having higher inductance and higher DC superposition characteristics can be produced. In the present specification, the phrase "substantially perpendicular" means within a range of 90°±10°.

The electronic component 100 according to the present embodiment can be applied to a wide range of applications. Among them, the electronic component 100 according to the present embodiment can achieve excellent DC superposition characteristics, whereby the electronic component 100 can be applied to a thin film inductor requiring high DC superposition characteristics.

[Method for Producing Electronic Component]

Figures 4A, 4B, 4C:
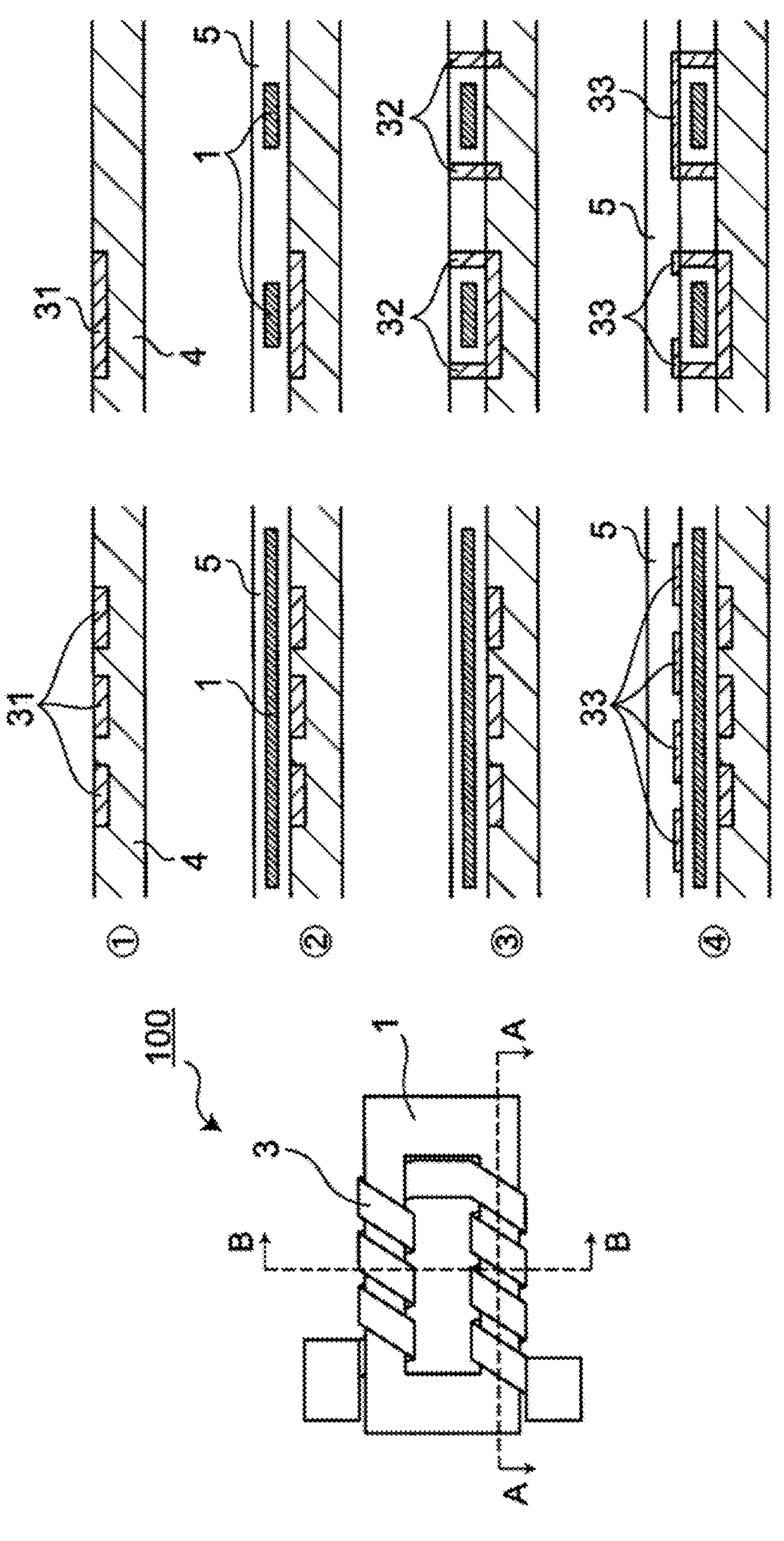
FIGS. 4A to 4C are schematic views each illustrating a method for producing an electronic component.

Next, an example of a method for producing the electronic component 100 will be described below with reference to FIGS. 4A to 4C. FIG. 4A is a schematic view illustrating the structure of the electronic component 100. FIG. 4B is a diagram corresponding to the A-A cross section of the electronic component 100 in FIG. 4A. FIG. 4C is a diagram corresponding to the B-B cross section of the electronic component 100 in FIG. 4A. In FIG. 4A, an insulating film covering the surface of the coil conductor 3 is omitted.

First, a resist is patterned into a desired shape on a supporting substrate 4 such as a silicon substrate or a glass substrate by using photolithography. A cavity of the resist is etched to a desired depth using RIE or the like. Next, a conductor such as Cu is embedded in the etched portion by plating or the like, and the resist is removed to form a lower coil 31 (1). Next, an insulating film 5 made of a photoresist resin or $SiO_2$ or the like is formed on the entire surface of the supporting substrate 4 including the surface of the lower coil 31. The magnetic structure 1 (or the magnetic laminate 10) is formed on the insulating film 5 by using a sputtering method or the like. The resist is patterned, and the extra magnetic structure 1 (or magnetic laminate 10) is then removed by RIE or ion milling or the like. The resist is removed, and the insulating film 5 is then formed so as to cover the entire surface of the magnetic structure 1 (or the magnetic laminate 10) (2). Next, a cavity corresponding to the desired portion of the lower coil 31 is provided by patterning the resist. The insulating film 5 is etched to the lower coil 31 by RIE or the like. A conductor such as Cu is embedded in the etched portion by plating or the like to form a pillar 32 connecting the lower coil 31 to an upper coil 33 to be described later, and the resist is then removed (3). Next, the resist is patterned, and a conductor such as Cu is then embedded in the cavity to form the upper coil 33. The resist is removed, and the insulating film 5 is then formed so as to cover the entire surface of the upper coil 33. Thus, the electronic component 100 can be produced.

EXAMPLES

Example 1

In order to examine the dependency of an anisotropic magnetic field Hk on the thickness of a non-magnetic metal layer, magnetic laminates of Tests 1 to 6 were prepared by the following procedure.

(Test 1)

An amorphous magnetic metal material and a non-magnetic metal material were formed using a sputtering apparatus. First, the amorphous magnetic metal material was formed at a thickness of 30 nm on a Si substrate to form a magnetic metal layer. The composition of the amorphous magnetic metal material was set to Fe(83.3)-Si(4)-B(8)-P(4)-Cu(0.7) (at %). Next, Cr (chromium) as the non-magnetic metal material was deposited at a thickness of 1.0 nm on the magnetic metal layer, to form a non-magnetic metal layer. In the same procedure, amorphous magnetic metal materials and non-magnetic metal materials were alternately formed to form a total of four magnetic metal layers and a total of three non-magnetic metal layers. Thus, the magnetic laminate of Example 1 was obtained. The average thicknesses of the magnetic metal layer and non-magnetic metal layer configuring the magnetic laminate may be considered to be respectively the same as the film thicknesses of the amorphous magnetic metal material and non-magnetic metal material.

(Test 2 to Test 5)

Magnetic laminates of Tests 2 to 5 were prepared in the same procedure as in Test 1 except that the film thickness of a non-magnetic metal material (Cr) was changed to 1 nm, 1.5 nm, 5 nm, and 10 nm.

(Test 6)

Using a sputtering apparatus, an amorphous magnetic metal material was formed at a thickness of 120 nm on a Si substrate, to form a magnetic metal layer. The magnetic metal layer was used as a magnetic laminate of Test 6 including no non-magnetic metal layer.

Figure 5:
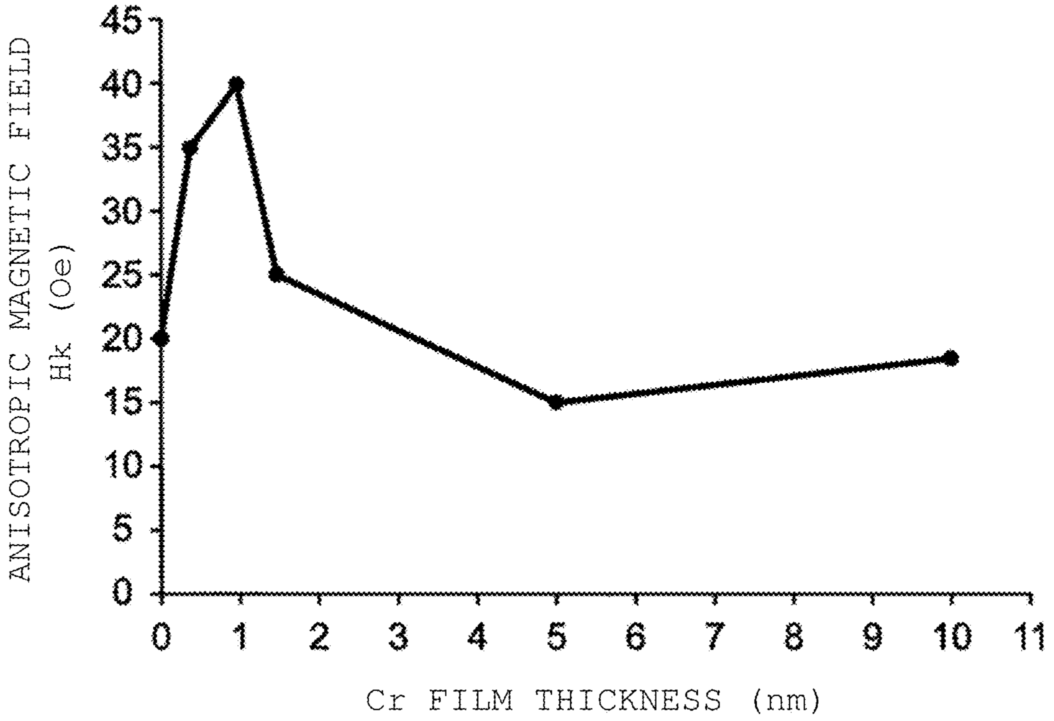
FIG. 5 is a graph showing the dependency of an anisotropic magnetic field Hk on the thickness of a non-magnetic metal layer.

The anisotropic magnetic field Hk of each of the magnetic laminates of Tests 1 to 6 was measured using a vibrating sample type magnetometer. FIG. 5 shows the results. As shown in FIG. 5, the magnetic laminates of Tests 1 to 3 in which the thicknesses (average thicknesses) of the non-magnetic metal layers were 0.4 nm, 1 nm, and 1.5 nm had a larger anisotropic magnetic field Hk than that of the magnetic laminate of Test 6 containing no non-magnetic metal material. This is considered to be due to the fact that, in the magnetic laminates of Tests 1 and 2, the magnetic metal layers are coupled in an antiparallel manner with the non-magnetic metal layer interposed therebetween. In contrast, the magnetic laminates of Tests 4 and 5 in which the thicknesses (average thicknesses) of the non-magnetic metal layers were 5 nm and 10 nm had a smaller isotropic magnetic field Hk than that of the magnetic laminate of Test 6 including no non-magnetic metal material. This is considered to be due to the fact that the magnetic metal layers are coupled in a parallel manner.

Example 2

Figure 6A:
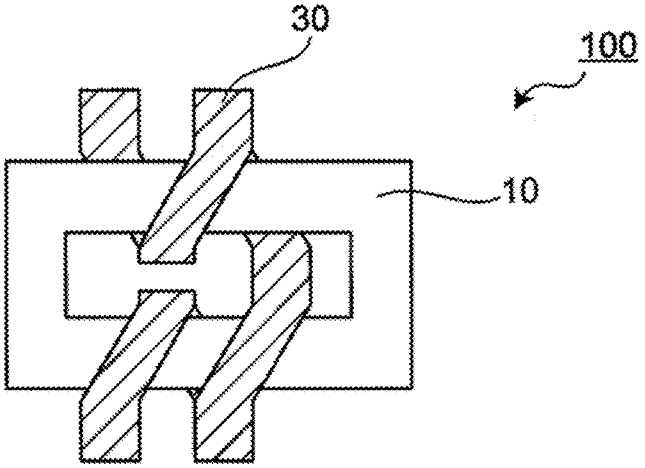
FIG. 6A is a model diagram used for a simulation.

In order to investigate the DC current dependency of the inductance L of a thin film inductor when an anisotropic magnetic field was 20 Oe, 25 Oe, 35 Oe, and 40 Oe, a simulation to be described below was performed. The simulation was performed using analysis simulation software Femtet (registered trademark) manufactured by Murata Software Co., Ltd. FIG. 6A shows a model diagram of a thin film inductor 100 used in the simulation. The thin film inductor 100 includes a magnetic structure 1 as a magnetic core. The structure of the magnetic structure 1 was set as shown in Table 1 below. Values shown in Table 1 are obtained when the anisotropic magnetic field Hk is 40 Oe. When the anisotropic magnetic field Hk was 20 Oe, 25 Oe, and 35 Oe, the thickness of a non-magnetic metal layer was set to 0 nm, 1.5 nm, and 0.4 nm, and other conditions (the thicknesses of a magnetic metal layer and insulating layer, and the numbers of magnetic metal layers, non-magnetic metal layers, magnetic layers, and insulating layers) were set to the same conditions as those when the anisotropic magnetic field Hk was 40 Oe.

TABLE 1

| | |
|---|---|
| Magnetic layer<br>Magnetic metal layer: 100 nm × total of four layers<br>Non-magnetic metal layer: 1.0 nm × total of three layers | 403 nm × total of 19 layers |
| Insulating layer | 10 nm × total of 20 layers |
| Total thickness of magnetic structure | 7857 nm |

Figure 6B:
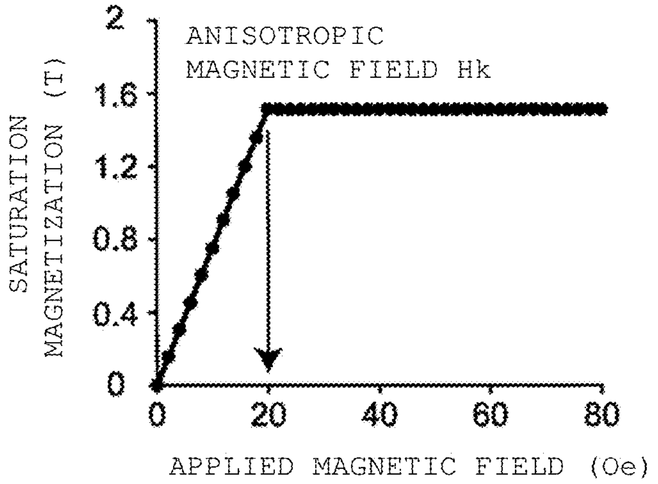
FIG. 6B is a B-H curve applied to a magnetic core in a simulation.

Under the above-described conditions, a simulation of the direct current dependency of the inductance L of the thin film inductor when the anisotropic magnetic field Hk was 20 Oe, 25 Oe, 35 Oe, and 40 Oe was performed. FIG. 6B shows an example of a B-H curve given as the material property of the magnetic core when the anisotropic magnetic field Hk is 20 Oe.

Figure 6C:
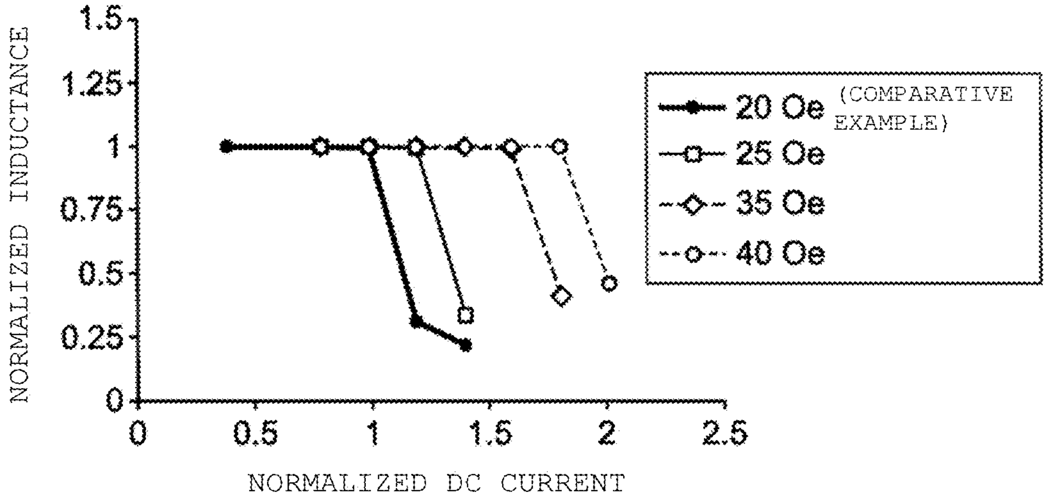
FIG. 6C is a graph showing the simulation results of the DC dependency of inductance L.

FIG. 6C shows the simulation results. In FIG. 6C, the inductance L and the current are normalized values. In Example 1, the anisotropic magnetic field Hk of the laminate of Test 6 including no non-magnetic metal layer was 20 Oe. Based on this result, taking the case where the anisotropic magnetic field Hk was 20 Oe as Comparative Example, the current value was normalized by setting a current value at which the inductance L started to rapidly decrease to 1 in Comparative Example. As shown in FIG. 6C, as the anisotropic magnetic field Hk increased, a DC current value at which the inductance L rapidly decreased increased. This means that, as the anisotropic magnetic field increases, a current value at which magnetic saturation occurs increases. That is, this means that, as the anisotropic magnetic field increases, the current value can be increased while the high inductance L is maintained. Therefore, the simulation demonstrated that, as the anisotropic magnetic field increases, DC superposition characteristics are improved.

Example 3

Figure 7A:
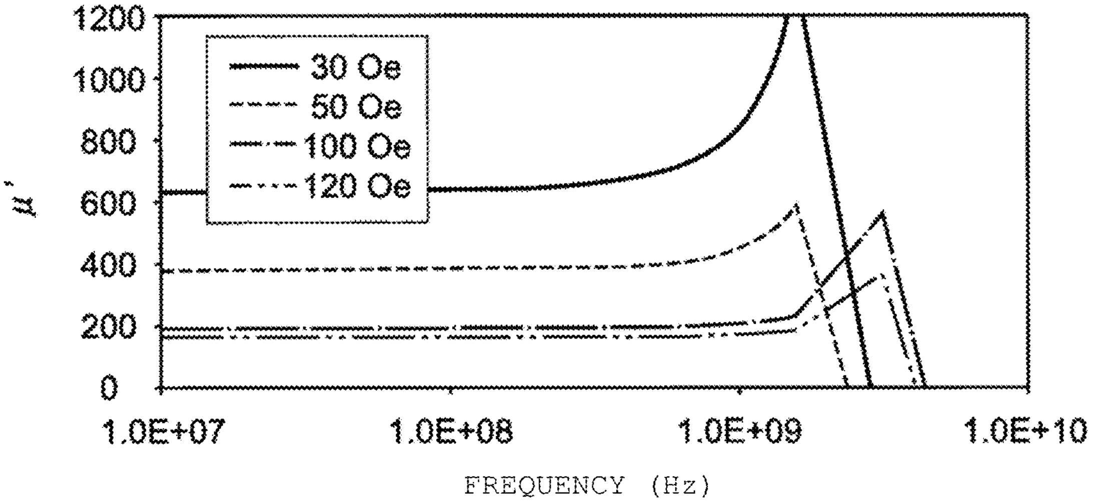
FIGS. 7A and 7B are graphs each showing the calculation results of the frequency dependencies of a real part and an imaginary part of a magnetic permeability in each anisotropic magnetic field.
Figure 7B:
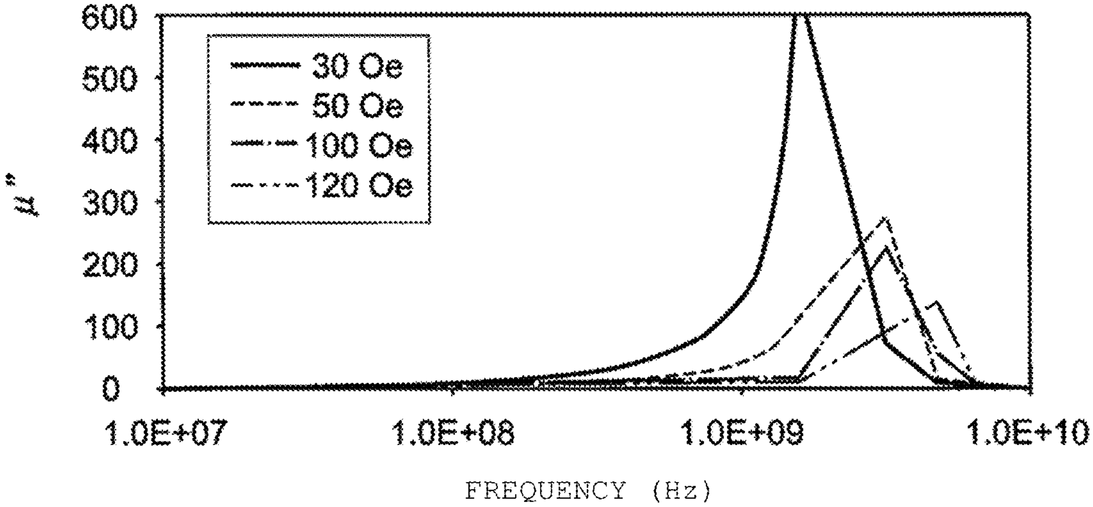

Using the technique described in "Absolute Value Measurements of Thin Film Magnetic Permeability in MHz Band" (Journal of the Magnetics Society of Japan, Vol. 15, No. 2, p. 327-330, 1991), the frequency dependencies of a real part and imaginary part μ" of the magnetic permeability of a magnetic structure in various anisotropic magnetic fields were calculated. The calculation was performed under the conditions of a film thickness of 100 nm, a specific resistance of 100 μΩcm, and a saturation magnetization of 1.5 T (tesla). FIGS. 7A and 7B show the calculation results. As shown in FIGS. 7A and 7B, as the anisotropic magnetic field increased, the resonant frequencies of μ' and μ" shifted to a higher frequency side. From this, it was found that, as the anisotropic magnetic field increases, the high-frequency magnetic characteristics of the magnetic structure are improved.

Example 4

Figure 8:
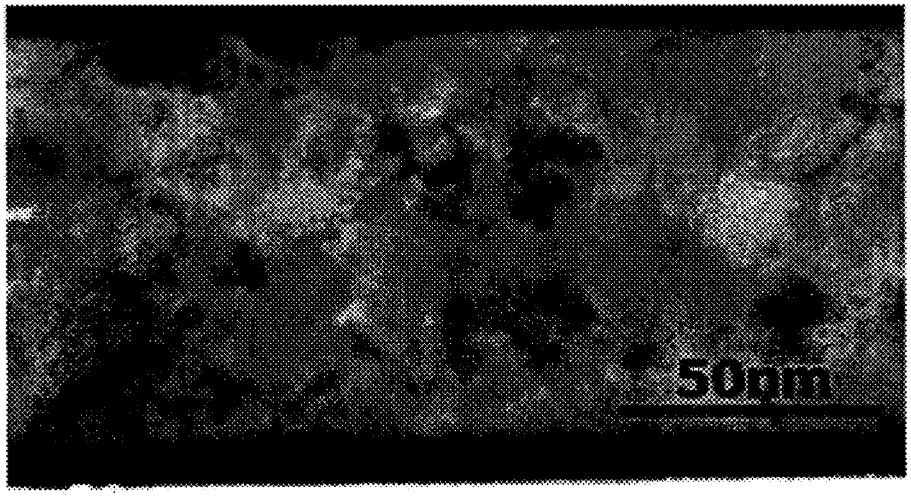
FIG. 8 is a cross-sectional STEM image of a magnetic metal layer after a heat treatment.

The following test was performed to confirm that a magnetic metal layer was nanocrystallized by subjecting a magnetic laminate or a magnetic structure to a heat treatment. First, Fe(83.3)-Si(4)-B(8)-P(4)-Cu(0.7) (at %) as an amorphous magnetic metal material was deposited at a thickness of about 100 nm on a silicon substrate, to form a magnetic metal layer. This magnetic metal layer was subjected to a heat treatment for increasing the temperature from room temperature to 375° C. at a temperature increase rate of 600° C./min. For each of the magnetic metal layer before the heat treatment and the magnetic metal layer after the heat treatment, a saturation magnetization when an external magnetic field of 500 Oe was applied under a room temperature environment was measured. Table 2 shows the results. The cross section of the magnetic metal layer after the heat treatment was observed with a scanning transmission electron microscope (STEM). FIG. 8 shows the obtained STEM image.

TABLE 2

| | Saturation magnetization (T) |
|---|---|
| Before heat treatment | 1.48 |
| After heat treatment | 1.59 |

As shown in Table 2, by the heat treatment, the saturation magnetization of the magnetic metal layer increased. From the STEM image of FIG. 8, it is found that nanocrystalline grains of about 10 nm or more and about 25 nm or less (i.e., from about 10 nm to about 25 nm) are precipitated in the magnetic metal layer. From these results, it could be confirmed that the heat treatment causes the magnetic metal layer to contain the nanocrystalline grains, thereby increasing the saturation magnetization.

Example 5

Figure 9:
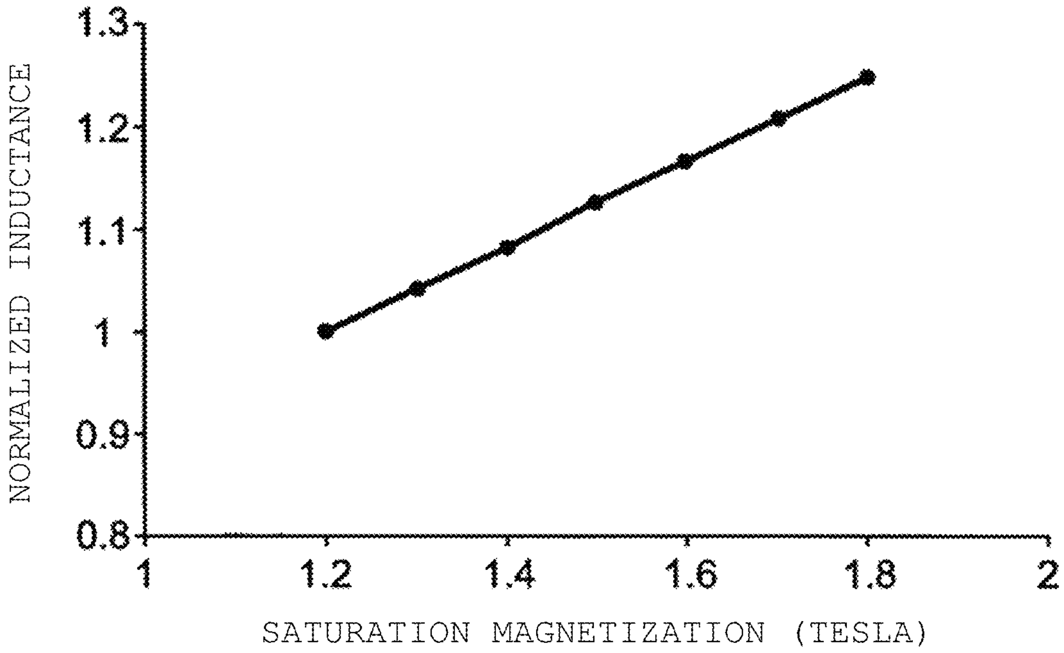
FIG. 9 is a graph showing the simulation results of the dependency of inductance L on a saturation magnetization Bs.

In order to investigate the dependency of the inductance L of a thin film inductor on a saturation magnetization Bs, a simulation was performed using the same model diagram (FIG. 6A) and analysis simulation software as those in Example 2. As the material properties of a magnetic core, a saturation magnetization value was changed while the anisotropic magnetic field of a magnetic structure was fixed at 40 Oe. FIG. 9 shows the simulation results. From FIG. 9, it is found that, as the saturation magnetization Bs increases, the inductance L monotonically increases. From this, it is found that, as the saturation magnetization of the magnetic metal layer increases, the inductance increases.

The present disclosure includes the following aspects, but it is not limited to these aspects.

(Aspect 1)

A magnetic laminate in which magnetic metal layers and non-magnetic metal layers are alternately laminated, the non-magnetic metal layer being disposed between the magnetic metal layers, the magnetic metal layer containing an amorphous material, and the non-magnetic metal layer containing at least one element selected from the group consisting of Cr, Ru, Rh, Ir, Re, and Cu, and having an average thickness of 0.4 nm or more and 1.5 nm or less (i.e., from 0.4 nm to 1.5 nm).

(Aspect 2)

A magnetic laminate in which magnetic metal layers and non-magnetic metal layers are alternately laminated, the non-magnetic metal layer being disposed between the magnetic metal layers, the magnetic metal layer containing an amorphous material, and the magnetic metal layers being coupled in an antiparallel manner with the non-magnetic metal layer interposed therebetween.

(Aspect 3)

The magnetic laminate according to aspect 1 or 2, wherein the magnetic metal layer further contains nanocrystalline grains dispersed in the amorphous material.

(Aspect 4)

The magnetic laminate according to aspect 1 or 2, wherein the magnetic metal layer is made of only the amorphous material.

(Aspect 5)

The magnetic laminate according to any one of aspects 1 to 4, wherein the magnetic metal layer has a composition represented by the general formula $Fe_{100-a-b-c}M_aP_bCu_c$, wherein M is at least one element selected from the group consisting of Si, B, and C; and a, b, and c are such that molar parts of the elements: $0.5 \le a \le 20$, $1 \le b \le 10$, and $0.1 \le c \le 1.5$ are set when the entire composition represented by the general formula is 100 molar parts.

(Aspect 6)

The magnetic laminate according to any one of aspects 1 to 5, wherein the magnetic metal layer has an average thickness of 100 nm or less.

(Aspect 7)

A magnetic structure in which magnetic layers and insulating layers are alternately laminated, the insulating layer being disposed between the magnetic layers, and the magnetic layer being the magnetic laminate according to any one of aspects 1 to 6.

(Aspect 8)

The magnetic structure according to aspect 7, wherein the insulating layer contains at least one selected from the group consisting of aluminum oxide, silicon oxide, aluminum nitride, silicon nitride, magnesium oxide, and zirconium oxide.

(Aspect 9)

An electronic component including the magnetic laminate according to any one of aspects 1 to 6, or the magnetic structure according to aspect 7 or 8.

(Aspect 10)

The electronic component according to aspect 9, further including a coil conductor, wherein the magnetic laminate or the magnetic structure is located inside a winding part of the coil conductor; and a winding axis direction of the coil conductor is substantially perpendicular to a lamination direction of the magnetic laminate or the magnetic structure.

(Aspect 11)

The electronic component according to aspect 10, wherein the magnetic laminate or the magnetic structure is annular.

(Aspect 12)

The electronic component according to aspect 10 or 11, wherein the electronic component is a thin film inductor.

(Aspect 13)

A method for producing a magnetic laminate according to any one of aspects 1 to 6, the method including the step of alternately forming amorphous magnetic metal materials and non-magnetic metal materials according to a thin film forming method, to form a magnetic laminate in which magnetic metal layers and non-magnetic metal layers are alternately laminated, and the non-magnetic metal layer is disposed between the magnetic metal layers.

(Aspect 14)

The method for producing a magnetic laminate according to aspect 13, further including the step of subjecting the magnetic laminate to a heat treatment.

A magnetic laminate, a magnetic structure including the same, an electronic component including the magnetic laminate or the magnetic structure, and a method for producing the magnetic laminate according to the present disclosure can achieve further suppressed magnetic saturation and higher DC superposition characteristics, whereby these can be suitably used for a wide range of applications such as high frequency applications.

What is claimed is:

1. A magnetic laminate in which magnetic metal layers and a non-magnetic metal layer are alternately laminated, the non-magnetic metal layer being disposed between the magnetic metal layers, at least one of the magnetic metal layers containing an amorphous material, and the non-magnetic metal layer containing at least one element selected from the group consisting of Cr, Ru, Rh, Ir, Re, and Cu, and having an average thickness of from 0.4 nm to 1.5 nm, wherein the amorphous material has a composition represented by the general formula $Fe_{100-a-b-c}M_aP_bCu_c$, wherein:

M is at least one element selected from the group consisting of Si, B, and C; and a, b, and c are such that molar parts of the elements: $0.5 \le a \le 20$, $1 \le b \le 10$, and $0.1 \le c \le 1.5$ are set when the entire composition represented by the general formula is 100 molar parts.

2. A magnetic laminate in which magnetic metal layers and a non-magnetic metal layer are alternately laminated, the non-magnetic metal layer being disposed between the magnetic metal layers;

at least one of the magnetic metal layers containing an amorphous material; and the magnetic metal layers being coupled in an antiparallel manner with the non-magnetic metal layer interposed therebetween, wherein at amorphous material has a composition represented by the general formula $Fe_{100-a-b-c}M_aP_bCu_c$, wherein:

M is at least one element selected from the group consisting of Si, B, and C; and a, b, and c are such that molar parts of the elements: $0.5 \le a \le 20$, $1 \le b \le 10$, and $0.1 \le c \le 1.5$ are set when the entire composition represented by the general formula is 100 molar parts.

3. The magnetic laminate according to claim 1, wherein at least one of the magnetic metal layers further contains nanocrystalline grains dispersed in the amorphous material.

4. The magnetic laminate according to claim 1, wherein at least one of the magnetic metal layers is made of only the amorphous material.

5. The magnetic laminate according to claim 1, wherein each of the magnetic metal layers has an average thickness of 100 nm or less.

6. A magnetic structure in which magnetic layers and at least one insulating layer are alternately laminated, the insulating layer being disposed between the magnetic layers, and the magnetic layer being the magnetic laminate according to claim 1.

7. The magnetic structure according to claim 6, wherein the insulating layer contains at least one selected from the group consisting of aluminum oxide, silicon oxide, aluminum nitride, silicon nitride, magnesium oxide, and zirconium oxide.

8. An electronic component comprising the magnetic laminate according to claim 1.

9. The electronic component according to claim 8, further comprising a coil conductor, wherein:

the magnetic laminate or the magnetic structure is located inside a winding part of the coil conductor; and a winding axis direction of the coil conductor is substantially perpendicular to a lamination direction of the magnetic laminate or the magnetic structure.

10. The electronic component according to claim 9, wherein the magnetic laminate or the magnetic structure is annular.

11. The electronic component according to claim 9, wherein the electronic component is a thin film inductor.

12. A method for producing a magnetic laminate according to claim 1, the method comprising alternately forming amorphous magnetic metal materials and non-magnetic metal materials according to a thin film forming method, to form a magnetic laminate in which magnetic metal layers and non-magnetic metal layers are alternately laminated, and the non-magnetic metal layer is disposed between the magnetic metal layers.

13. The method for producing a magnetic laminate according to claim 12, further comprising subjecting the magnetic laminate to a heat treatment.

14. The magnetic laminate according to claim 2, wherein at least one of the magnetic metal layers further contains nanocrystalline grains dispersed in the amorphous material.

15. The magnetic laminate according to claim 2, wherein at least one of the magnetic metal layers is made of only the amorphous material.

16. The magnetic laminate according to claim 2, wherein each of the magnetic metal layers has an average thickness of 100 nm or less.

17. A magnetic structure in which magnetic layers and insulating layers are alternately laminated, at least one of the insulating layer being disposed between the magnetic layers, and the magnetic layers being the magnetic laminate according to claim 2.

18. An electronic component comprising the magnetic structure according to claim 6.

* * * * *